*US006847092B2*

United States Patent
Maldei et al.

(10) Patent No.: US 6,847,092 B2
(45) Date of Patent: Jan. 25, 2005

(54) MICROELECTRONIC CAPACITOR STRUCTURE WITH RADIAL CURRENT FLOW

(75) Inventors: Michael Maldei, Durham, NC (US); Malati Hegde, Cary, NC (US); Guenter Gerstmeier, Chapel Hill, NC (US); Jinwhan Lee, Raleigh, NC (US); Steven M. Baker, Morrisville, NC (US); Jon S. Berry, II, Raleigh, NC (US); Brian Cousineau, Burlington, NC (US); Wenchao Zheng, Raleigh, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/383,191

(22) Filed: Mar. 6, 2003

(65) Prior Publication Data

US 2004/0173868 A1 Sep. 9, 2004

(51) Int. Cl.$^7$ ............................................. H01L 29/72
(52) U.S. Cl. ..................... 257/503; 257/504; 257/507; 257/508; 438/690; 438/692; 438/694
(58) Field of Search ................................. 257/503, 504, 257/507, 508; 438/690, 692, 694

(56) References Cited

U.S. PATENT DOCUMENTS 6,207,571 B1 * 3/2001 Juengling et al. ........... 438/692

* cited by examiner

Primary Examiner—Edward Wojciechowicz
(74) Attorney, Agent, or Firm—Brinks Hofer Gilson & Lione

(57) ABSTRACT

A capacitor for a semiconductor device and a method of manufacturing a capacitor for a semiconductor device is disclosed that uses radial current flow. The capacitor includes a semiconductor substrate that includes a plurality of insulation islands. An insulation layer is formed over the semiconductor substrate. Gate electrodes are formed on top of the insulation layer. An array of CD contact pads including a plurality of CD contacts are connected to the semiconductor substrate in a first predetermined number of locations. An array of CG contact pads including at least one CG contact connected to the gate electrodes such that each CG contact is connected to a respective gate electrode above a respective insulation island in a second predetermined number of locations.

49 Claims, 3 Drawing Sheets

MICROELECTRONIC CAPACITOR STRUCTURE WITH RADIAL CURRENT FLOW

FIELD OF THE INVENTION

The present invention relates generally to integrated circuit devices and manufacturing, and more particularly to an optimized microelectronic capacitor capable of providing radial current flow to charge and discharge the capacitor.

BACKGROUND OF THE INVENTION

Conventional metal-oxide silicon ("MOS") capacitors include electrical contacts that are made to a metal gate of the capacitor structure and a back contact that is made to the semiconductor of the capacitor structure. A basic MOS capacitor operates using charge distributions in the capacitor structure. The three general types of charge distribution that occur include accumulation, depletion and inversion conditions. Accumulation typically results from a negative voltage being applied to the gate of the capacitor structure and depletion occurs from a positive voltage being applied to the gate. Inversion generally occurs at positive voltages that are larger than a threshold voltage.

An example of a representative layout of a microelectronic capacitor 100 is illustrated in FIG. 1 in which the capacitor 100 generally consists of two conductive plates that are separated by a dielectric layer. The dielectric layer may be silicon oxide and is sandwiched between the capacitor plates that are preferably made using doped crystalline silicon and a gate conductor. Contact to the gate conductor plate is established using a double row of contact-to-gate "CG" contacts 102 that are located at the middle of the rectangular capacitor structure. During operation, the double row of CG contacts provides a rectangular current flow.

The CG contacts 102 connect a first metallization layer with the conductive gate material. There is no crystalline silicon immediately underneath the CG contacts 102. Instead, an island of silicon oxide is situated underneath the CG contacts 102. Contact to the crystalline silicon plate is established using a plurality of contact-to-diffusion "CD" contacts 104. The CD contacts 104 connect the first metallization layer with the crystalline silicon surface or substrate. The CD contacts 104 are located at the circumference of the rectangular shaped capacitor.

Capacitor charging and discharging speed is dependent on the capacitance of the parallel-plate capacitor and also on the total internal resistance of the capacitor. The higher the total internal resistance, the slower the capacitor can be charged or discharged. The total internal resistance for a microelectronic capacitor consists of the CD contact resistance, the doped crystalline silicon resistance, the gate conductor resistance and the CG contact resistance. As such, the total internal capacitor resistance can be computed as follows:

$R_{capacitor, internal} = R_{CD\ contacts} + R_{crystal.Si} + R_{gate\ conductor} + R_{CG\ contacts}$.

Based on the above-referenced equation, it can be determined that for the microelectronic capacitor layout set forth in FIG. 1, the component resistances have a contribution to the total internal resistance of the capacitor of the following percentages: $R_{CD\ contacts}=1.1\%$; $R_{crystal.Si}=95.2\%$; $R_{gate\ conductor}=3.6\%$; $R_{CG\ contacts}=0.1\%$. It can clearly be seen that the crystalline silicon has the largest contribution to the total internal capacitor resistance. Capacitor sizes range from a few um$^2$ to several 1000 um$^2$ and even larger dependent on the specific application and the total area of the capacitor needed for the CD contacts is about 7.4% and for the CG contacts 6.2%.

A problem with the current art of microelectronic capacitor layout is that the internal resistances are not optimized. The total internal resistance is also too high, which leads to unnecessary delays in the charging and discharging speed of capacitors in circuits. In order to optimize a microelectronic capacitor layout, it is not advisable to simply increase the number of CG and CD contacts. Such an increase would not only increase the total capacitor area but would also lead to only a minimal benefit in the total internal capacitor resistance. Alternatively, the crystalline silicon area could be split up in an attempt to minimize the current path through the crystalline silicon. However, this would lead to a substantial increase in the total capacitor area.

As such, a microelectronic capacitor layout is needed that reduces the total internal resistance of the capacitor and the area needed to manufacture the capacitor on the silicon substrate.

SUMMARY OF THE INVENTION

A preferred embodiment of the present invention discloses a microelectronic capacitor and a method of manufacturing a microelectronic capacitor having increased speed at which the capacitor may be charged and discharged. The present invention also discloses a microelectronic capacitor layout and method of manufacture that decreases the total area that is required for the microelectronic capacitor. The capacitor may be used in DRAM circuits but may also be used in all other types of microelectronic circuits (embedded DRAM or logic) where capacitors are used in the creation of integrated circuits or interlock circuits.

The capacitor includes a semiconductor substrate that includes a plurality of insulation islands that are formed in a first predetermined number of locations of the semiconductor substrate. A thin insulation layer is formed on the semiconductor substrate and may also be formed over the insulation islands. A plurality of gate electrodes is formed on top of the insulation layer in a second predetermined number of locations. An array of CD contact areas are provided that include a plurality of CD contacts that are connected to the semiconductor substrate. An array of CG contact areas are also provided that include a plurality of CG contacts that are connected to the gate electrodes in a third predetermined number of locations such that each CG contact is connected to the gate electrodes above a respective insulation island of the semiconductor substrate.

The gate electrodes of the capacitor preferentially include a first conductive layer, a second conductive layer and a third non-conductive layer. The first conductive layer comprises polysilicon, the second conductive layer comprises tungsten silicide and the third non-conductive layer comprises silicon nitride. In the preferred embodiment, the CG contacts are connected to the second conductive layer of respective gate electrodes.

A second insulation layer is deposited or formed between the CD contacts and the CG contacts. The second insulation layer is preferentially formed using boro-phospho-silicate glass ("BPSG"). A metallization layer may be deposited that interconnects the CD contacts to form a first electrode of the capacitor. The metallization layer may also be deposited that interconnects the CG contacts to form a second electrode of the capacitor. These metallization layers may be deposited separately for making the connections to the CD and CG contacts (e.g. a first and a second metallization layer). The CD contacts consist of a plurality of vias that are connected to the semiconductor substrate. The CG contacts consist of a plurality of vias that are connected to the gate electrode of the capacitor.

The array of CD contact areas are preferably positioned in relation to the array of CG contact areas to create an optimal radial current flow through the CD contacts and the CG contacts. The CD and CG contacts may be arranged in a predetermined geometrical pattern. The CD and CG contact areas are positioned in relation to the semiconductor substrate such that a radial current distribution is created and the CD and CG contact areas do not block current flow from each other.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like reference numerals designate corresponding parts throughout the different views.

DETAILED DESCRIPTION OF THE PREFERRED EMBODIMENTS

Reference will now be made in detail to the preferred embodiments of the present invention, examples of which are illustrated in the accompanying drawings. The present invention discloses a capacitor for a semiconductor device that provides faster charging and discharging times while consuming a smaller total surface area or less real estate of the semiconductor chip. The present invention accomplishes this by changing the fundamental flow of current within the capacitor. Instead of using a rectangular current flow system, the present invention provides a radial current flow system. The present invention decreases the area that is necessary for microelectronic capacitor layout, which is extremely important in the microelectronic industry. In addition, for a given capacitor area, the present invention increases the speed at which the capacitor can be charged and discharged.

Figure 1:
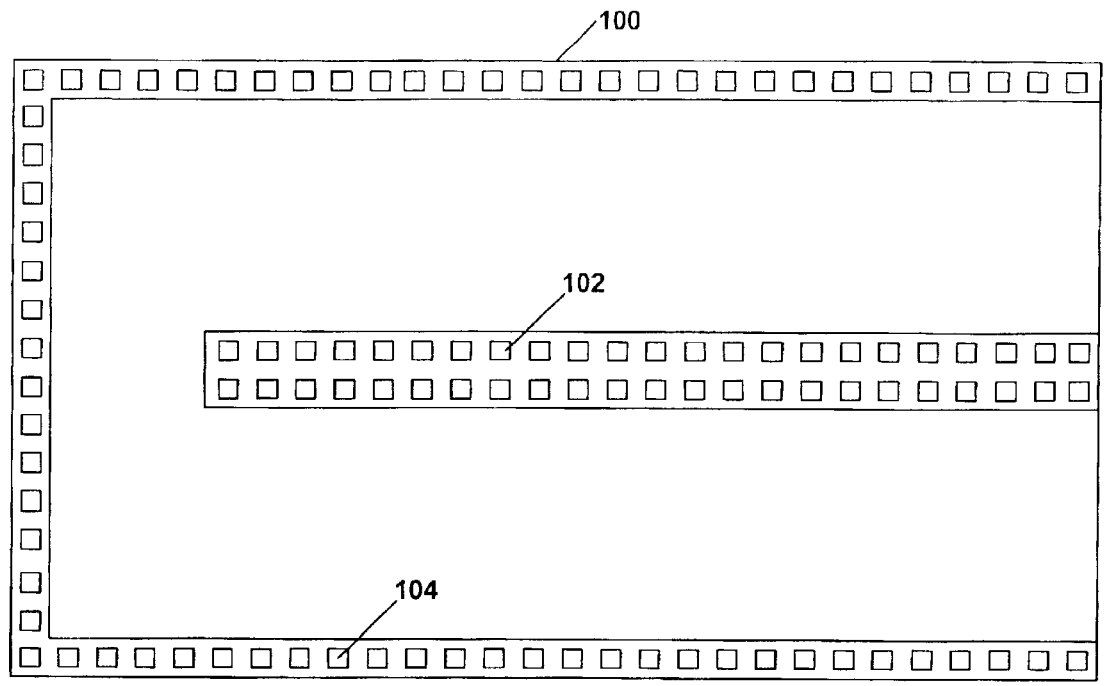
FIG. 1 illustrates a prior art layout for CD contacts and CG contacts in a semiconductor capacitor.
Figure 2:
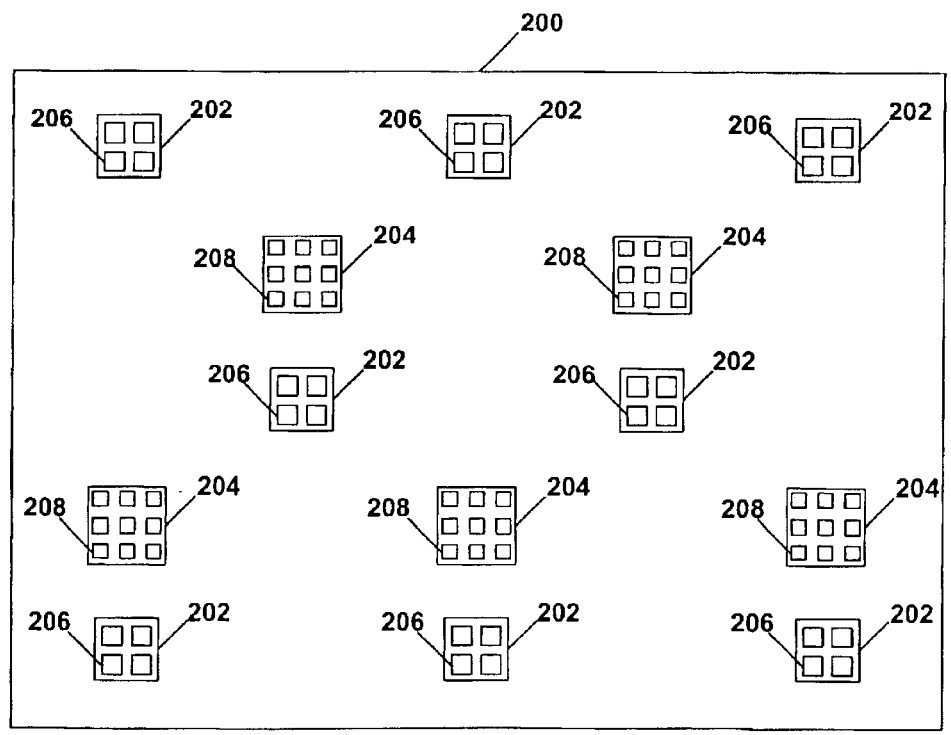
FIG. 2 is a top layout view for CD contacts and CG contacts in a semiconductor capacitor.

FIG. 2 is a top layout view of a microelectronic capacitor 200 that includes an array or network of CG contact areas or locations 202 and an array or network of CD contact areas or locations 204. The array of CG contact areas 202 includes a predetermined number of CG contacts 206 that are arranged in a predetermined geometric pattern. The CD contact areas 204 may also include a predetermined number of CD contacts 208 that may also be arranged in a predetermined geometric pattern. Only the CG and CD contacts 206, 208 are shown in FIG. 2 while the crystalline silicon and conductor plates have been omitted for clarity.

The array of CG contact areas 202 and CD contact areas 204 are advantageously arranged in an alternating rectangular pattern in FIG. 2 for illustration purposes only. The CG contacts 206 and the CD contacts 208 within the CG and CD contact areas 202, 204 may also be arranged in a rectangular pattern or any other geometrical pattern. Other arrangements or layouts of the CG and CD contact areas 202, 204 and the CG and CD contacts 206, 208 are envisioned by the present invention. The layout of the CG and CD contact areas 202, 204 and CG and CD the contacts 206, 208 is such that the contact areas 202, 204 and the contacts 206, 208 are capable of providing an optimal radial current flow during operation.

Figure 3:
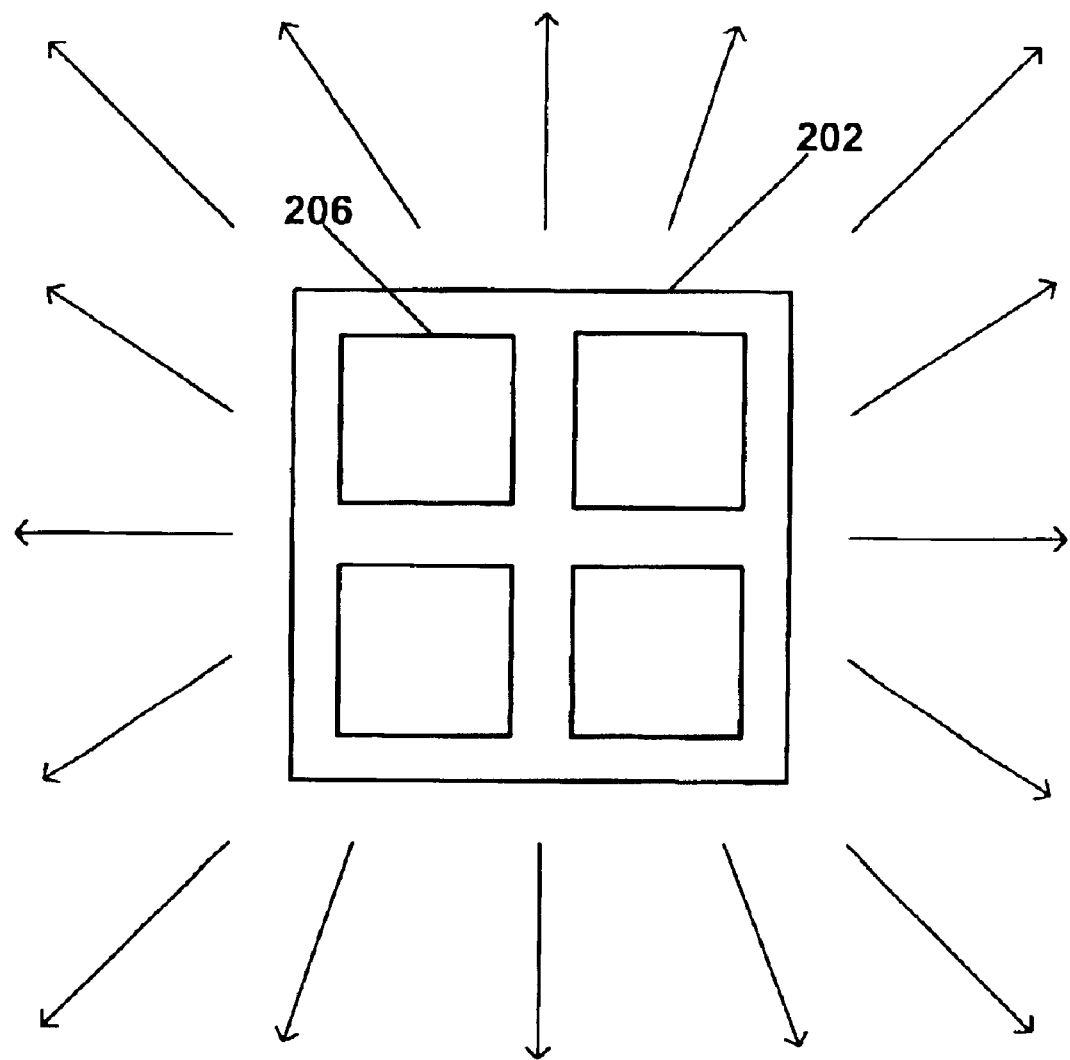
FIG. 3 illustrates radial current flow in CD contacts and CG contacts in the semiconductor capacitor.

Referring to FIG. 3, the placement of the CG and CD contacts 206, 208 allows current to enter respective capacitor plates that may be associated with the CG and CD contacts 206, 208 in a radial fashion. As set forth in greater detail below, an island of silicon oxide is placed under each CG contact 206 and a gate conductor that has a BPSG island may be placed wherever the CD contacts 208 are located. The arrangement of the CG contact areas 202 and the CD contact areas 204 decreases the number of contacts that need to be used in the capacitor 200, thereby decreasing the area that is consumed by the capacitor 200 and the resistance of the capacitor 200. The network of CG contact areas 202 is offset from the CD contact areas 204 so that the radial current flow is not blocked by an island of silicon oxide or BPSG.

For the purpose of the present invention, the component resistances are set forth below, where the crystalline silicon and gate conductor disc resistances have been calculated according to $R_{disc}=(R_{square}/2*Pi)*1n$ (radius out/radius in). As such, the total internal capacitor resistance can be computed as follows: $R_{capacitor,\ internal}=R_{CD\ contacts}+R_{crystal.Si\ disc}+R_{gate\ conductor\ disc}+R_{CG\ contacts}$. It has been determined that this total internal resistance is approximately 62% smaller than the total resistance in the prior art, which provides a faster charging and discharging speed. The number of CD contacts may also be increased, effectively enlarging the inner radius of the crystalline silicon disk, to lower the crystalline silicon plate resistance even more.

In the preferred embodiment of the present invention, the component resistances have a contribution to the total resistance of the following percentages: $R_{CD\ contacts}=5.3\%$ (vs. 1.1% in prior art); $R_{crystal.Si}=89.0\%$ (vs. 95.2% in prior art); $R_{gate\ conductor}=3.6\%$ (vs. 4.1% in prior art); and $R_{CG\ contacts}=1.6\%$ (vs. 0.1% in prior art). Based on the decrease of the total internal capacitor resistance, it can also be calculated that the time to charge and discharge the capacitor to 95% (($3\times\tau$)=$3\times R\times C$) is decreased by approximately 62%.

As an example, with a total capacitor area for the present invention of 175 um$^2$, the area contribution for the contacts becomes: AREA CD=4.4% (vs. 7.4% in prior art) and AREA CG 2.2% (vs. 6.2% in prior art). As a result, the total capacitor area saved is: (7.4%−4.4%)+(6.2%−2.2%)=7.0%. The preferred capacitor 200 uses a radial current distribution system in contrast to a rectangular current distribution system as used in the prior art. The capacitor 200 also delivers a decrease in charging and discharging time while decreasing the total capacitor area.

Figure 4:
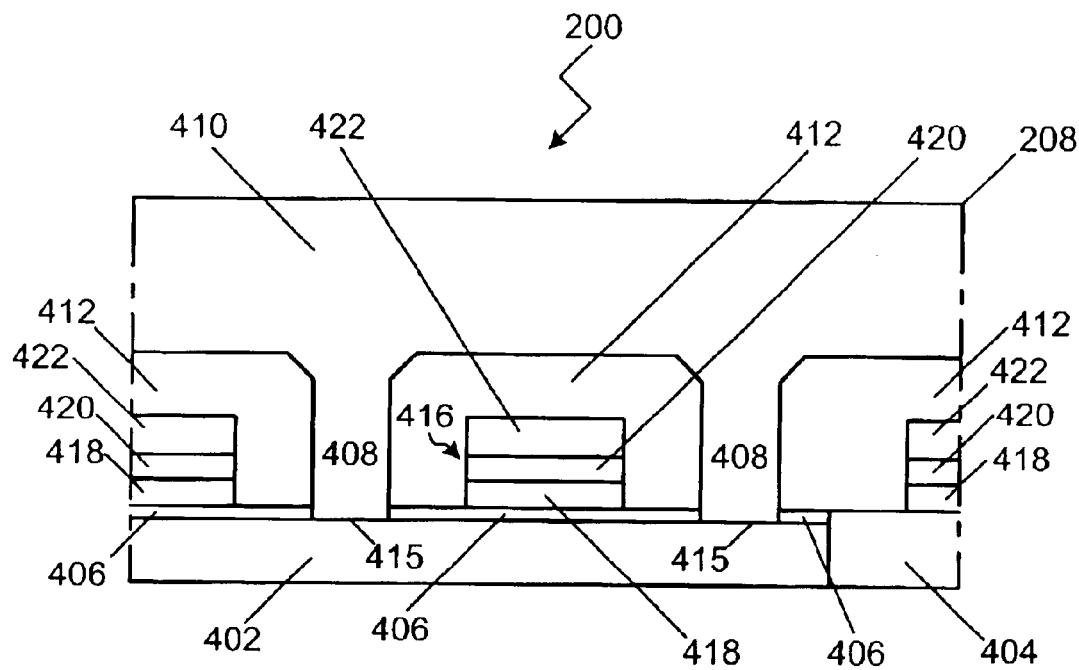
FIG. 4 is a cross-sectional view of a representative CD contact of the capacitor illustrated in FIG. 2.

FIG. 4 shows a cross-sectional view of the preferred capacitor 200 in which illustrative CD contacts 208 are shown that have been fabricated as part of the capacitor 200. The capacitor 200 includes a semiconductor substrate 402 that is preferentially made using crystalline silicon, doped crystalline silicon or any substance or compound equivalent thereto. As set forth in greater detail below, a portion of the substrate 402 includes an insulation island 404 that has been formed in the substrate 402. The insulation island 404 is a dielectric and may be formed using silicon oxide. As further illustrated in FIG. 4, a thin insulator layer 406 may also be formed on top of the substrate 402, which may also be formed as silicon oxide.

The CD contact pads 204 include a plurality of vias 408 that are preferentially formed to be connected to the substrate 402. The vias 408 are filled with metal, tungsten in the preferred embodiment, to complete the connection of the substrate 402 to a first metallization layer 410. The combination of the vias 408 and the substrate 402 create a lower electrode or lower plate 415 of the capacitor 200. A second insulation layer 412 is deposited between the vias 408 of the CD contact pads 204. In the preferred embodiment, the second insulation layer 412 comprises BPSG or some other equivalent compound capable of acting as a high dielectric.

A plurality of gate electrodes or upper plates 416 are formed between the vias 408 of the CD contact pads 204 and are separated from the vias 408 by the second insulation layer 412. As illustrated in FIG. 4, the gate electrode 416 of the capacitor 200 may be formed with three layers of material, which include a first conductive gate layer 418, a second conductive gate layer 420 and a third non-conductive gate layer 422. A portion of the first gate layer 418 is deposited on the substrate 402, but it is important to note that the CG contacts 206 are located on the insulation islands 404. A gate oxide layer 406 is also located between the first conductive layer 418 and the substrate 402.

In the preferred embodiment, the first conductive gate layer 418 comprises a layer of polysilicon. As known in the art, polysilicon is silicon with a poly-crystalline grain structure, which acts as a conductor of electricity. It is often used as the gate in MOS transistors as well as for short interconnects between them. The preferred second conductive gate layer 420 is made using tungsten silicide, which is a better conductor than polysilicon and is used to improve the overall conductivity of the gate. The preferred third non-conductive gate layer 422 is made by forming a layer of silicon nitride, which is a silicon compound used to "protect" the conductive gate material elsewhere in the circuitry during a special contact etch.

Figure 5:
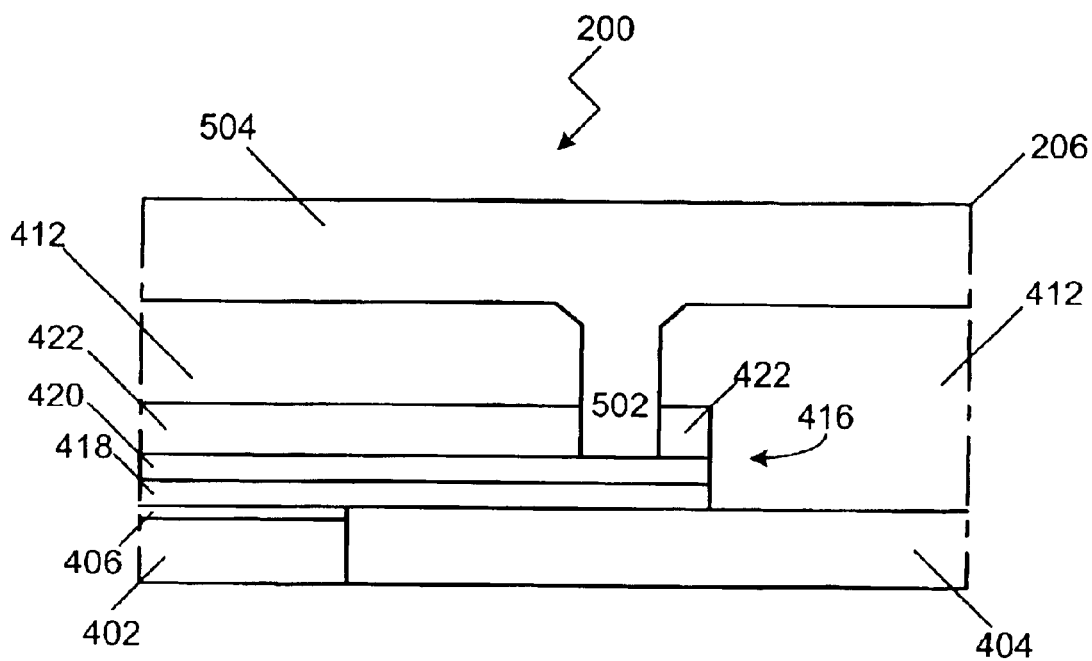
FIG. 5 is a cross-sectional view of a representative CG contact of the capacitor illustrated in FIG. 2.

Referring to FIG. 5, wherein like numbered elements refer to the same elements illustrated throughout the figures, a cross-section of the capacitor 200 is illustrated that shows how a respective CG contact 206 makes contact with the gate electrode 416. As illustrated, a portion of the gate electrode 416 is located on top of the insulation island 404. The CG contact 206 includes a via 502 that connects a second metallization layer 504 with the gate electrode 416. The vias 502 of the CD contacts 206 are connected to the gate electrodes 416 only in areas where the gate electrodes 416 are positioned on top of the insulation islands 404.

As set forth above, the gate electrode 416 includes three layers of material that include the first conductive gate layer 418, the second conductive gate layer 420, and a third non-conductive gate layer 422. As illustrated, the via 502 is formed to make contact with the second conductive gate layer 420 of the gate electrode 416. The second conductive gate layer 420 is made using tungsten silicide, which is a good gate conductor material used in silicon technology. The via 502 and the gate electrode 416 is surrounded by the second insulation layer 412. As set forth above, the second insulation layer 412 comprises BPSG or some other equivalent compound capable of acting as a high dielectric.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. A capacitor for a semiconductor device, comprising:
   a semiconductor substrate including a plurality of insulation islands;
   an insulation layer formed over the semiconductor substrate;
   a plurality of gate electrodes formed on top of the insulation layer;
   an array of CD contact pads including a plurality of CD contacts connected to the semiconductor substrate in a first predetermined number of locations; and
   an array of CG contact pads including at least one CG contact connected to the gate electrodes such that each CG contact is connected to a respective gate electrode above a respective insulation island in a second predetermined number of locations.

2. The capacitor of claim 1, where the insulation islands are formed of silicon oxide.

3. The capacitor of claim 1, where the insulation layer comprises a thin layer of silicon oxide.

4. The capacitor of claim 1, where the gate electrodes include a first conductive layer, a second conductive layer and a third non-conductive layer.

5. The capacitor of claim 4, where the first conductive layer comprises polysilicon.

6. The capacitor of claim 4, where the second conductive layer comprises tungsten silicide.

7. The capacitor of claim 4, where the third non-conductive layer comprises silicon nitride.

8. The capacitor of claim 4, where the CG contacts are connected to the second conductive layer of the gate electrode.

9. The capacitor of claim 1, further comprising a second insulation layer deposited between the CD contacts and the CG contacts.

10. The capacitor of claim 9, where the second insulation layer comprises BPSG.

11. The capacitor of claim 1, further comprising a first metallization layer connecting the CD contacts to form a first electrode of the capacitor.

12. The capacitor of claim 1, further comprising a second metallization layer connecting the CG contacts to form a second electrode of the capacitor.

13. The capacitor of claim 1, where the CD contacts comprise a plurality of vias that are connected to the semiconductor substrate.

14. The capacitor of claim 13, where the vias are formed with tungsten.

15. The capacitor of claim 1, where the CG contacts comprise a plurality of vias that are connected to the gate electrode.

16. The capacitor of claim 15, where the vias are formed with tungsten.

17. The capacitor of claim 1, where the array of CD contact pads are positioned in relation to the array of CG contact pads to create an optimal radial current flow.

18. The capacitor of claim 1, where the CD contacts are arranged in a predetermined geometrical pattern.

19. The capacitor of claim 1, where the CG contacts are arranged in a predetermined geometrical pattern.

20. A method of manufacturing a capacitor on a semiconductor substrate, comprising the steps of:
   forming a plurality of insulation islands in the semiconductor substrate;

forming an insulation layer over the semiconductor substrate and the insulation islands;

forming a plurality of gate electrodes in a predetermined number of locations on the semiconductor substrate and the insulation islands;

forming an array of CD contact pads that include at least one contact that is connected to the semiconductor substrate; and forming an array of CG contact pads that include at least one contact that is connected to the gate electrode at predetermined locations above the insulation islands.

21. The method of claim 20, where the insulation islands are formed of silicon oxide.

22. The method of claim 20, where the insulation layer comprises a thin layer of silicon oxide.

23. The method of claim 20, where the gate electrodes include a first conductive layer, a second conductive layer and a third conductive layer.

24. The method of claim 23, where the first conductive layer comprises polysilicon.

25. The method of claim 23, where the second conductive layer comprises tungsten silicide.

26. The method of claim 23, where the third non-conductive layer comprises silicon nitride.

27. The method of claim 23, where the CG contacts are connected to the second layer of the gate electrode.

28. The method of claim 20, further comprising the step of forming a second insulation layer between the CD contacts and the CG contacts.

29. The method of claim 28, where the second insulation layer comprises BPSG.

30. The method of claim 20, further comprising the step of forming a first metallization layer interconnecting the CD contacts to form a first electrode of the capacitor.

31. The method of claim 20, further comprising the step of forming a second metallization layer interconnecting the CG contacts to form a second electrode of the capacitor.

32. The method of claim 20, where the CD contacts comprise a plurality of vias that are connected to the semiconductor substrate.

33. The method of claim 20, where the CG contacts comprise a plurality of vias that are connected to the gate electrode.

34. The method of claim 20, where the array of CD contact pads are positioned in relation to the array of CG contact pads to create an optimal current flow.

35. The method of claim 20, where the CD contacts are arranged in a predetermined geometrical pattern.

36. The method of claim 20, where the CG contacts are arranged in a predetermined geometrical pattern.

37. A capacitor for a semiconductor device, comprising:

a semiconductor substrate including a plurality of insulation islands;

an insulation layer formed over the semiconductor substrate;

a plurality of gate electrodes formed on top of the insulation layer;

an array of CD contact pads including a plurality of CD contacts that are arranged in a predetermined geometric pattern connected to the semiconductor substrate;

an array of CG contact pads including a plurality of CG contacts that are arranged in a predetermined geometric pattern connected to the gate electrodes such that each CG contact is connected to a respective gate electrode above a respective insulation island; and where the array of CD contact pads are positioned in relation to the CG contact pads to create an optimal radial current flow in the capacitor.

38. The capacitor of claim 37, where the gate electrodes include a first conductive layer, a second conductive layer and a third non-conductive layer.

39. The capacitor of claim 38, where the CG contacts are connected to the second conductive layer of the gate electrode.

40. The capacitor of claim 37, further comprising a second insulation layer formed between the CD contacts and the CG contacts.

41. The capacitor of claim 37, further comprising a first metallization layer interconnecting the CD contacts to form a respective electrode of the capacitor.

42. The capacitor of claim 37, further comprising a second metallization layer interconnecting the CG contacts to form a respective electrode of the capacitor.

43. A method of manufacturing a capacitor on a semiconductor substrate, comprising the steps of:

forming a plurality of insulation islands in the semiconductor substrate;

forming an insulation layer over the semiconductor substrate and the insulation islands;

forming a plurality of gate electrodes in a predetermined number of locations on the semiconductor substrate and the insulation islands;

forming an array of CD contact areas that include a plurality of CG contacts that are arranged in a predetermined geometric pattern and are connected to the semiconductor substrate; and forming an array of CG areas that include a plurality of CG contacts that are arranged in a second predetermined geometric pattern and are connected to the gate electrode at predetermined locations above the insulation islands.

44. The method of claim 43, where the array of CD contact areas are positioned in relation to the array of CG contact locations to create an optimal current flow.

45. The method of claim 43, where the gate electrodes include a first conductive layer, a second conductive layer and a third non-conductive layer.

46. The method of claim 45, where the CG contacts are connected to the second conductive layer of the gate electrode.

47. The method of claim 43, further comprising the step of forming a second insulation layer between the CD contacts and the CG contacts.

48. The method of claim 43, further comprising the step of forming a metallization layer interconnecting the CD contacts to form an electrode of the capacitor.

49. The method of claim 43, further comprising the step of forming a metallization layer interconnecting the CG contacts to form an electrode of the capacitor.

* * * * *